(12) United States Patent
Papadopoulos et al.

(10) Patent No.: US 12,068,312 B2
(45) Date of Patent: Aug. 20, 2024

(54) REVERSE CONDUCTING INSULATED GATE POWER SEMICONDUCTOR DEVICE HAVING LOW CONDUCTION LOSSES

(71) Applicant: Hitachi Energy Ltd, Zürich (CH)

(72) Inventors: Charalampos Papadopoulos, Lenzburg (CH); Munaf Rahimo, Gänsbrunnen (CH); Chiara Corvasce, Bergdietikon (CH)

(73) Assignee: Hitachi Energy Ltd, Zürich (CH)

( * ) Notice: Subject to any disclaimer, the term of this patent is extended or adjusted under 35 U.S.C. 154(b) by 481 days.

(21) Appl. No.: 17/442,019

(22) PCT Filed: Mar. 13, 2020

(86) PCT No.: PCT/EP2020/056779
§ 371 (c)(1),
(2) Date: Sep. 22, 2021

(87) PCT Pub. No.: WO2020/193180
PCT Pub. Date: Oct. 1, 2020

(65) Prior Publication Data
US 2022/0181319 A1    Jun. 9, 2022

(30) Foreign Application Priority Data
Mar. 22, 2019 (EP) .................................. 19164634

(51) Int. Cl.
*H01L 27/00*    (2006.01)
*H01L 27/07*    (2006.01)
(Continued)

(52) U.S. Cl.
CPC ...... *H01L 27/0727* (2013.01); *H01L 29/0696* (2013.01); *H01L 29/7397* (2013.01);
(Continued)

(58) Field of Classification Search
CPC ............. H01L 27/0727; H01L 29/7395; H01L 29/7397; H01L 29/7803; H01L 29/7805
See application file for complete search history.

(56) References Cited

U.S. PATENT DOCUMENTS 8,502,345 B2    8/2013    Nemoto et al.
9,159,819 B2    10/2015    Pfirsch et al.
(Continued)

FOREIGN PATENT DOCUMENTS

CN    101393915 A    3/2009
CN    101764139 A    6/2010
(Continued)

OTHER PUBLICATIONS

Rahimo, M. et al., "The Bimode Insulated Gate Transistor (BIGT), an ideal power semiconductor for power electronics based DC Breaker applications", B4-302, 2009 21st International Symposium on Power Semiconductor Devices & IC's, Barcelona, Spain, Jun. 14-18, 2009, 8 pages.

*Primary Examiner* — Reema Patel
(74) *Attorney, Agent, or Firm* — Slater Matsil, LLP (57) ABSTRACT

A reverse conducting insulated gate power semiconductor device is provided which comprises a plurality of active unit cells (40) and a pilot diode unit cell (50) comprising a second conductivity type anode region (51) in direct contact with a first main electrode (21) and extending from a first main side (11) to a first depth (d1). Each active unit cell (40) comprises a first conductivity type first source layer (41a) in direct contact with the first main electrode (21), a second conductivity type base layer (42) and a first gate electrode (47a), which is separated from the first source layer (41a) and the second conductivity type base layer (42) by a first gate insulating layer (46a) to form a first field effect transistor structure. A lateral size (w) of the anode region (51) in an orthogonal projection onto a vertical plane perpendicular (Continued)

to the first main side (11) is equal to or less than 1 μm. On a first lateral side surface of the anode region (51) a first insulating layer (52*a*) is arranged and on an opposing second lateral side surface of the anode region (51) a second insulating layer (52*b*) is arranged. And a distance between the first insulating layer (52*a*) and the second insulating layer (52*b*) is equal to or less than 1 μm, the first insulating layer (52*a*) extending vertically from the first main side (11) to a second depth (d2), and the second insulating layer (52*b*) extending vertically from the first main side (11) to a third depth (d3), wherein the first depth (d1) is less than the second depth (d2) and less than the third depth (d3).

20 Claims, 7 Drawing Sheets (51) Int. Cl.
*H01L 29/06* (2006.01)
*H01L 29/739* (2006.01)
*H01L 29/861* (2006.01)
*H01L 29/78* (2006.01)

(52) U.S. Cl.
CPC ...... *H01L 29/8611* (2013.01); *H01L 29/7805* (2013.01); *H01L 29/8613* (2013.01)

(56) References Cited

U.S. PATENT DOCUMENTS

| | | | |
|---|---|---|---|
| 2009/0072300 A1 | 3/2009 | Yamamoto et al. | |
| 2010/0090248 A1 | 4/2010 | Kouno | |
| 2012/0056242 A1 | 3/2012 | Tsuzuki et al. | |
| 2012/0181575 A1 | 7/2012 | Pfirsch | |
| 2012/0319163 A1 | 12/2012 | Tsuzuki et al. | |
| 2013/0099279 A1 | 4/2013 | Storasta et al. | |
| 2014/0070270 A1 | 3/2014 | Yoshida et al. | |
| 2014/0124830 A1 | 5/2014 | Rahimo et al. | |
| 2015/0179637 A1 | 6/2015 | Pfirsch et al. | |
| 2015/0236143 A1 | 8/2015 | Pfirsch et al. | |
| 2015/0295071 A1 | 10/2015 | Hikasa | |
| 2016/0079235 A1 | 3/2016 | Matsudai et al. | |
| 2016/0079369 A1 | 3/2016 | Ogura et al. | |
| 2016/0093725 A1 | 3/2016 | Takahashi | |
| 2016/0141400 A1 | 5/2016 | Takahashi | |
| 2016/0372584 A1 | 12/2016 | Kimura et al. | |
| 2018/0261594 A1 | 9/2018 | Yamano et al. | |
| 2018/0294258 A1 | 10/2018 | Kamibaba et al. | |

FOREIGN PATENT DOCUMENTS

| | | |
|---|---|---|
| CN | 102593168 A | 7/2012 |
| CN | 102832216 A | 12/2012 |
| CN | 102934231 A | 2/2013 |
| CN | 103875074 A | 6/2014 |
| CN | 104733519 A | 6/2015 |
| EP | 3107123 A1 | 12/2016 |
| JP | 2013161918 A | 8/2013 |
| JP | 2014075582 A | 4/2014 |
| JP | 2015213163 A | 11/2015 |
| JP | 2016058636 A | 4/2016 |
| JP | 2016058654 A | 4/2016 |
| JP | 2016096222 A | 5/2016 |
| JP | 2018152426 A | 9/2018 |
| JP | 2018181949 A | 11/2018 |
| KR | 101679107 B1 | 11/2016 |
| WO | 2015118714 A1 | 8/2015 |

REVERSE CONDUCTING INSULATED GATE POWER SEMICONDUCTOR DEVICE HAVING LOW CONDUCTION LOSSES

CROSS-REFERENCE TO RELATED APPLICATIONS

This application is a national stage application of International Application No. PCT/EP2020/056779, filed on Mar. 13, 2020, which claims priority to European Patent Application No. 19164634.8, filed on Mar. 22, 2019, which application is hereby incorporated herein by reference.

TECHNICAL FIELD

The invention relates to the field of power electronics particular embodiments relate to a reverse conducting insulated gate power semiconductor device.

BACKGROUND

A reverse conducting (RC) insulated gate power semiconductor device well known in the prior art is the reverse conducting insulated gate bipolar transistor (RC-IGBT). In the RC-IGBT a diode and an IGBT are monolithically integrated on the same wafer or chip by introducing n$^+$ doped collector shorts in a part of the p$^+$ doped collector layer of an IGBT structure. The RC-IGBT can be either a planar RC-IGBT with a planar MOSFET structure on its emitter side or a trench RC-IGBT with a trench MOSFET structure on the emitter side of the device.

In the publication "The Bi-mode Insulated Gate Transistor (BiGT) A potential technology for higher power applications" by M. Rahimo et al. (in Proc. Int. Sym. on Power Semiconductor Devices & IC's ISPSD '09, Barcelona, Spain, 2009, pp. 283-286) there is disclosed an advanced RC-IGBT concept referred to as the Bi-mode Insulated Gate Transistor (BIGT). The BIGT is aimed at overcoming certain constraints of the common RC-IGBT for high voltages and hard switching applications. Specifically, one of the implications of anode shorting in the RC-IGBT is the voltage snapback effect which is observed as a negative resistance region in the device IGBT mode I-V characteristics. Such voltage snapback effect has a particular negative impact when devices are paralleled, especially at low temperatures. The BIGT is basically a hybrid structure consisting of an RC-IGBT and a standard IGBT (also referred to as pilot IGBT) in a single chip.

Figure 1:
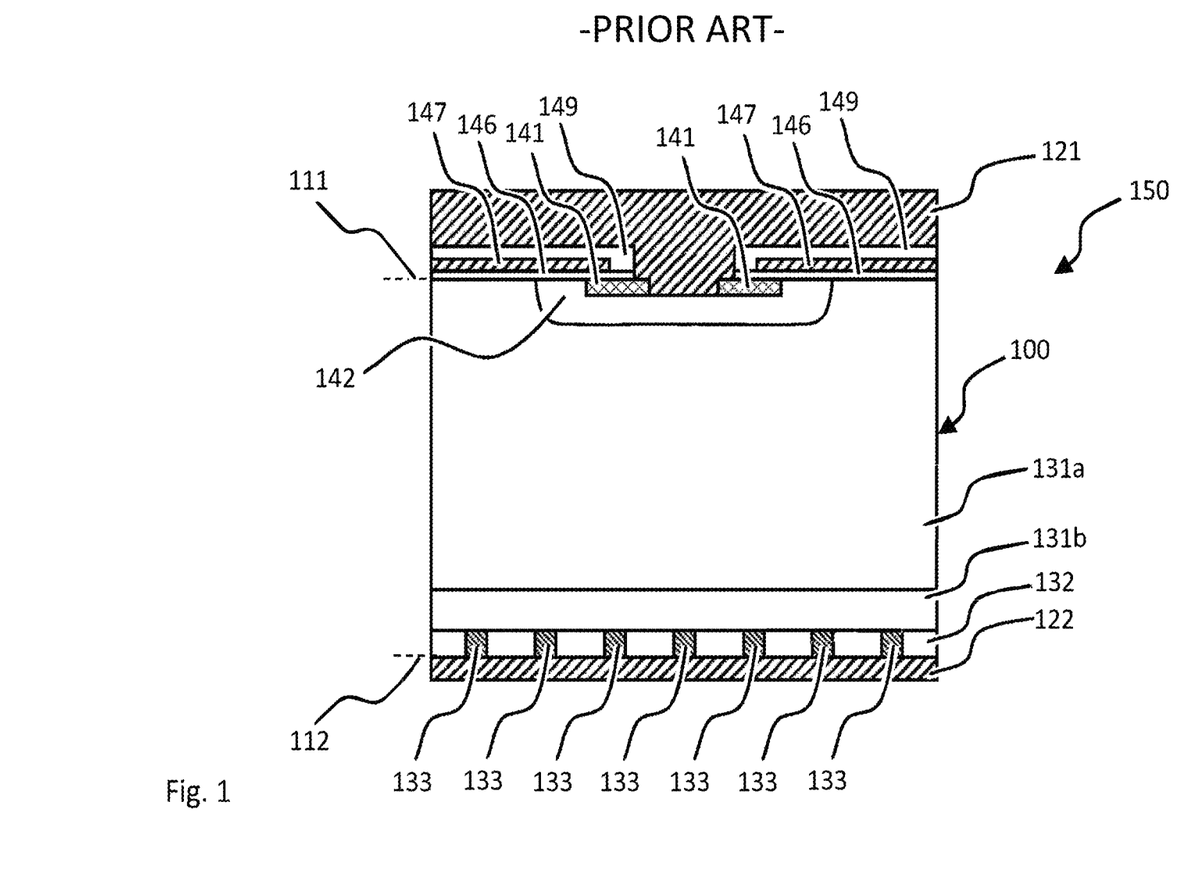
FIG. 1 shows a prior art planar RC-IGBT in a vertical cross-section.

FIG. 1 shows a prior art RC-IGBT 150 with a planar gate electrode 147 according to a known implementation. As shown in FIG. 1, the RC-IGBT 150 includes within one wafer 100 an insulated gate bipolar transistor (IGBT) with a built-in freewheeling diode. More specifically, the wafer 100 has a first main side in, which is the emitter side of the integrated IGBT and the anode side of the built-in freewheeling diode, and a second main side 112, which is the collector side of the IGBT and the cathode side of the built-in freewheeling diode. The second main side 112 lies opposite the first main side 111. An n-type drift layer 131a is arranged between the first main side in and the second main side 112, and a p-type base layer 142 is arranged as a well region in the drift layer 131a at the first main side 111 of the wafer 100. Also, n-type source regions 141 with a higher doping than the drift layer 131a are formed as well regions in the p-type base layer 142 at the first main side 111 of the wafer 100.

An electrically insulating gate insulating layer 146 is arranged on the first main side 111 and covers part of the p-type base layer 142, the drift layer 131a and the source regions 141. The planar gate electrode 147 is formed on the gate insulating layer 146 to form a MOS structure with the gate insulating layer 146 and the base layer 142. A first main electrode 121 is arranged on the first main side 111 to be in direct electrical contact to the source regions 141 and to the p-type base layer 142, whereas it is electrically insulated from the planar gate electrode 147 by another insulating layer 149 covering the planar gate electrode 147.

An n-type buffer layer 131b is arranged on the drift layer 131a at the second main side 112, and a p-type collector layer 132 is arranged on a side of the buffer layer 131b which is opposite the drift layer 131a. Plural n-type collector shorts 133 are arranged to penetrate through the collector layer 132 to electrically connect the buffer layer 131b to a second main electrode 122, which is arranged on the second main side 112 to be in direct electrical contact to the collector layer 132 and to the collector shorts 133. The collector shorts 133 and the buffer layer 131b have a higher doping concentration than the drift layer 131a.

The collector shorts 133, the buffer layer 131b, the drift layer 131a and the p-type base layer 142 form the built-in freewheeling diode with a pin structure between the second main electrode 122, which forms a cathode electrode of the built-in freewheeling diode, and the first main electrode 121, which forms an anode electrode of the built-in freewheeling diode.

In such prior art RC-IGBT 150 the p-type base layer 142 of the IGBT cell is utilized as an anode of the built-in freewheeling diode when the device is in the diode mode. However, the p-type base layer 142 is in contact with the n-type source regions 141 which in turn might be connected with the drift layer 131a via an n-type conductive channel that is formed in the base layer 142 below the gate electrode 147 if the gate voltage exceeds a threshold value. The conductive channel short-circuits the pn junction between the p-type base layer 142 and the drift layer 131a. As a result, the pn junction between the p-type base layer 142 and the drift layer 131a may not be forward biased and hole injection from the base layer 142 into the drift layer 131a may be prevented. A current is maintained by the unipolar electron current flowing through the conductive channel. The pn junction between the base layer 142 and the drift layer 131a starts injecting holes eventually when the potential difference reaches the built in voltage of the pn junction. However, the voltage at the contacts could be much higher. When the hole injection starts, the conductivity of the drift layer 131a is modulated and the voltage drop is reduced. Therefore, depending on the gate voltage, the diode exhibits a characteristic MOS controlled negative resistance region (voltage snap-back) in the I-V characteristics. With the gate voltage above the threshold value, the snap back is the largest, while with the voltage below the threshold or negative, no conductive channel is formed and the snapback is absent completely. In addition, the conductive channel is controlling the plasma concentration below the p-type base layer 142 during the internal diode conduction. By applying a gate voltage above the threshold value, the plasma is extracted through the induced channel, therefore reducing the plasma below the p-type base layer 142, which results in higher on-state losses compared to the situation when the gate emitter voltage $V_{GE}$ is below the threshold value. In various applications gate control during the diode mode cannot be chosen freely, so the device should be able to provide good performance also at positive gate voltages applied to the gate electrode.

In US 2013/099279 A1 there is described a planar RC-IGBT in which additional p-type wells are arranged in the same plane as the base layer but outside the active cells. The p-type wells are electrically connected to the emitter electrode directly or via the base layer. The diode formed by the p-type wells outside the active cells are sometimes also referred to as pilot diodes and the regions in which the p-type wells are arranged may be referred to as pilot diode regions. The pilot diode regions provide improved injection levels and low conduction losses in diode mode (reverse conducting state) of the RC-IGBT at any gate voltage applied to the gate electrode. However, in IGBT mode (forward conducting state) of the RC-IGBT the pilot diode regions result in significantly higher IGBT on-state losses due to outflow of holes from the drift layer into the p-type wells resulting in a lowered plasma density in the drift layer and thereby in a higher resistance of the drift layer.

In a trench RC-IGBT the conduction losses in diode mode (i.e. reverse conducting mode) may be even higher than in a planar RC-IGBT when a positive gate voltage is applied to the trench gate electrode because injection level of holes from the p-type base layer into the drift layer may be lowered even more efficiently by the conductive channel along the trench gate electrode due to a stronger shorting effect.

From US 2014/070270 A1, US 2016/0093725 A1 or US 2015/0236143 A1 there is respectively known a trench RC-IGBT in which pilot diode regions are arranged outside of active cells to reduce the conduction losses in the diode mode. The pilot diode regions comprise p-type layers which are connected to the emitter electrode and which are laterally sandwiched between two neighboring trench gate electrodes similar to the p-type base layer in the active cells. However, as in the planar RC-IGBT known from US 2013/099279 A1, which employs pilot diode regions, the conduction losses in the IGBT mode (i.e. in forward on-state) of the RC-IGBT are relatively high.

SUMMARY

Embodiments of the invention provide a reverse conducting insulated gate power semiconductor device which has an improved trade-off between the conduction losses in diode and IGBT mode, i.e. in reverse and forward conducting mode.

In a first embodiment, a reverse conducting insulated gate power semiconductor device comprises a wafer having a first main side and a second main side opposite to the first main side, a first main electrode on the first main side and a second main electrode on the second main side. The wafer comprises a first conductivity type base layer, a second conductivity type collector layer which is in direct contact with the first conductivity type base layer to form a first pn junction and which is in direct contact with the second main electrode, at least one collector short which electrically connects the first conductivity type base layer to the second main electrode, a plurality of active unit cells adjacent to the first main side, and a pilot diode unit cell. The pilot diode unit cell comprises a second conductivity type anode region extending from the first main side to a first depth, wherein the anode region is in direct contact with the first main electrode and is in direct contact with the first conductivity type base layer to form a second pn junction. Each active unit cell comprises a first conductivity type first source layer, which is in direct contact with the first main electrode on the first main side, a second conductivity type base layer on a side of the first conductivity type base layer opposite to the collector layer, wherein the first conductivity type base layer is in direct contact with the second conductivity type base layer to form a third pn junction and wherein the second conductivity type base layer is in direct contact with the first source layer to form a fourth pn junction, and a first gate electrode which is separated from the first source layer, the second conductivity type base layer and the first conductivity type base layer by a first gate insulating layer to form a first field effect transistor structure. A lateral size of the anode region in an orthogonal projection onto a vertical plane perpendicular to the first main side is equal to or less than 1 μm, wherein a lateral direction is defined as a direction parallel to the first main side. A first insulating layer is arranged on a first lateral side surface of the anode region, and a second insulating layer is arranged on a second lateral side surface of the anode region opposing to the first lateral side surface of the anode region in a direction which is parallel to the first main side and which is parallel to the vertical plane. In a vertical cross-section of the pilot diode unit cell with the vertical plane, a distance between the first insulating layer and the second insulating layer is equal to or less than 1 μm, the first insulating layer extending vertically from the first main side to a second depth, and the second insulating layer extending vertically from the first main side to a third depth, wherein the first depth is less than the second depth and less than the third depth.

The new pilot diode concept provides improved trade-off between the diode and IGBT modes conduction losses. The new pilot diode regions are employed between two adjacent insulating layers with a distance equal to or below 1 μm. This will result in a high level of hole injection in diode mode and a much lower hole drainage level in IGBT mode compared to the known reverse conducting insulated gate power semiconductor devices.

In an exemplary embodiment any straight line connecting any first point in the second conductivity type base layer of an adjacent active unit cell with any second point in the anode region intersects the first or second insulating layer, wherein the adjacent active unit cell is that active unit cell of the plurality of active unit cells of which the second conductivity type base layer has the smallest lateral distance to the anode region. Such arrangement of the second insulating layer between the active cell and the anode region of the pilot diode region can prevent drainage of holes from the active cell into the anode region more efficiently.

In an exemplary embodiment a lateral distance of the anode region to the second conductivity type base layer of each active unit cell is at least 15 μm. In such exemplary embodiment cross-effecting between the active unit cells and the pilot diode region is avoided most efficiently.

In an exemplary embodiment a surface portion of the wafer extending on the first main side from the anode region to the second conductivity type base layer of the adjacent active unit cell is electrically insulated from the first main electrode. In this exemplary embodiment the region between the pilot diode region is more effectively decoupled from the active unit cell by a region which is not in direct contact with the first main electrode.

In an exemplary embodiment the anode region extends in the vertical cross-section laterally from the first insulating layer to the second insulating layer.

In an exemplary embodiment the first depth is less than 50% of the second depth and less than 50% of the third depth, exemplarily less than one third of the second depth and less than one third of the third depth.

In an exemplary embodiment the second conductivity base layer and the first gate electrode of each active unit cell have in an orthogonal projection onto a plane parallel to the first main side a stripe-shape, a longitudinal main axis of the stripe-shape respectively being parallel to a first direction parallel to the first main side. Throughout this specification, a stripe-shape may be any planar shape in which the width in a first direction is at least twice the width in a second direction perpendicular to the first direction. The longitudinal main axis of a stripe-shape shall be defined throughout this specification as that axis of the planar stripe-shape which extends along a direction in which the stripe-shape has its largest extension.

In the latter exemplary embodiment the pilot diode unit cell may be stripe-shaped, wherein the anode region, the first insulating layer and the second insulating layer have in the orthogonal projection onto the plane parallel to the first main side a stripe-shape, a longitudinal main axis of the stripe-shape respectively being parallel to the first direction. Therein, plural stripe-shaped pilot diode unit cells may be provided, wherein, in a direction parallel to the first main side and perpendicular to the first direction, pilot diode unit cells alternate with groups of active unit cells, each group of active unit cells comprising plural active unit cells.

In an exemplary embodiment the field effect transistor structure of each active unit cell is a trench field effect transistor structure in which the first gate electrode is structured as a first trench gate electrode. Accordingly, in this exemplary embodiment the reverse conducting insulated gate power semiconductor device is a trench-type device. A trench gate electrode shall be understood throughout the specification as a gate electrode which extends from the first main side into the wafer in a direction towards the second main side wherein the second conductivity type base layer is arranged on a lateral side of the trench gate electrode, whereas a planar gate electrode shall be understood throughout the specification as a gate electrode which extends on the first main side wherein the second conductivity type base layer is arranged on a side of the planar gate electrode facing in a direction perpendicular to the first main side towards the second main side.

In an exemplary embodiment, laterally between each pilot diode unit cell and the second conductivity type base layer of an adjacent active unit cell there is arranged the first gate electrode of the adjacent active unit cell, which is that active unit cell of the plurality of active unit cells of which the second conductivity type base layer has the smallest lateral distance to the anode region of the respective pilot diode unit cell.

In an exemplary embodiment each active unit cell comprises: a first conductivity type second source layer, which is in direct contact with the first main electrode on the first main side and is in direct contact with the second conductivity type base layer to form a fifth pn junction, and a second gate electrode having a second gate insulating layer and an electrically conductive second gate layer, which is separated from the second source layer, the second conductivity type base layer and the first conductivity type base layer by the second gate insulating layer to form a second field effect transistor structure in the active unit cell, wherein the first and the second gate electrodes of each active unit cell are trench gate electrodes between which the second conductivity type base layer, the first source layer and the second source layer are laterally interposed.

In the latter exemplary embodiment, the second gate electrode of each active unit cell may have in an orthogonal projection onto a plane parallel to the first main side a stripe-shape, wherein a longitudinal main axis of the stripe-shape is parallel to the first direction.

Therein, the first source layer may comprise plural separate first source layer regions and the second source layer may comprise plural separate second source layer regions, wherein along a direction parallel to the first direction first source layer regions alternate with second source layer regions. In such exemplary embodiment in the IGBT mode the conductivity modulation of the plasma in the second conductivity type base layer is improved.

In an exemplary embodiment a dummy cell is arranged laterally between the pilot diode unit cell and an adjacent active unit cell, the dummy cell having at least a second conductivity type base layer and a source layer having the same structure as the corresponding layers in the active unit cells except that the second conductivity type base layer and the source layer are not electrically connected to the first main electrode, wherein the adjacent active unit cell is that active unit cell of the plurality of active unit cells of which the second conductivity type base layer has the smallest lateral distance to the anode region. In such exemplary embodiment the dummy cell provides efficient means for decoupling the pilot diode unit cell from the adjacent active unit cell. Exemplary, the dummy cell has the same structure as an active unit cell except that it is not electrically connected to the first main electrode.

BRIEF DESCRIPTION OF THE DRAWINGS

The subject matter of the invention will become apparent for the skilled person from the following detailed description of embodiments with reference to the attached drawings, in which.

The reference symbols used in the figures and their meanings are summarized in the list of reference symbols. Generally, alike or alike-functioning parts are given the same reference symbols. The described embodiments are meant as examples and shall not limit the scope of the invention as defined by the appended claims.

The list of reference signs follows:
1, 150 planar RC-IGBT
2, 3, 4 trench RC-IGBT
10, 10', 100 wafer
11, 111 first main side
12, 112 second main side
21, 121 first main electrode 22, 122 second main electrode
31 n-type (first) base layer
31a, 131a drift layer
31b, 131b buffer layer
32, 132 collector layer
33, 133 collector short
40, 40' active unit cell
41a, 41a' first source layer
41b, 41b' second source layer
42, 42', 142 p-type (second) base layer
46a, 46a' first gate insulating layer
46b, 46b' second gate insulating layer
47a, 47a' first gate electrode
47b, 47b' second gate electrode
50, 50' pilot diode unit cell
51, 51' anode region
52a, 52a' first insulating layer
52b, 52b' second insulating layer
60 dummy cell
72 insulating layer
135 buffer layer
141 n-type source region
145 gate electrode
146 gate insulating layer
147 gate electrode
149 insulating layer
d1 first depth
d2 second depth
d3 third depth
D, D' lateral distance
X second direction
Y first direction
w lateral size

DETAILED DESCRIPTION OF ILLUSTRATIVE EMBODIMENTS

Figure 2:
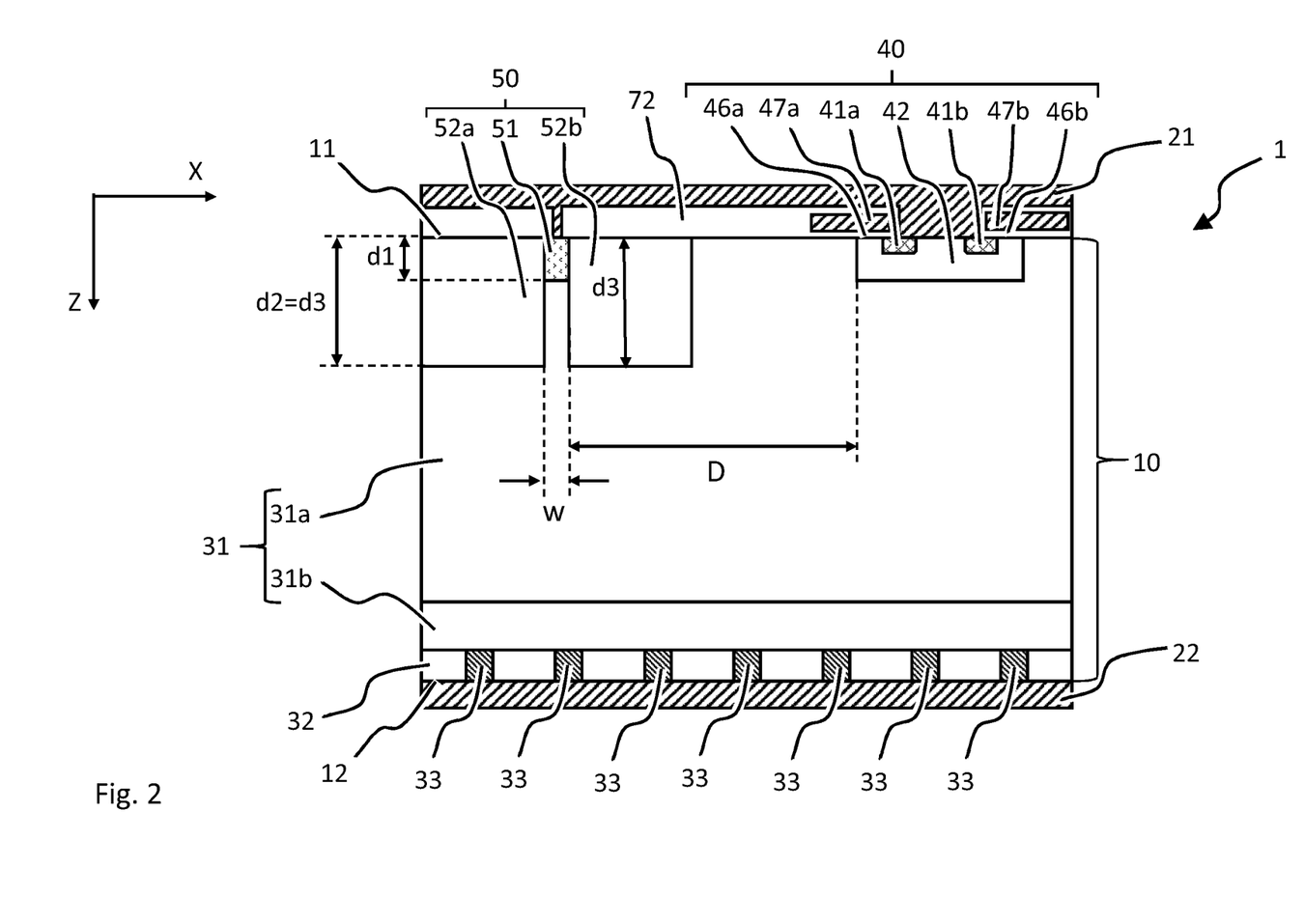
FIG. 2 shows a reverse conducting insulated gate power semiconductor device according to a first embodiment in a vertical cross-section along line I-I' in FIG. 3.

In the following, a first embodiment of the reverse conducting insulated gate power semiconductor device according to the invention is described with reference to FIGS. 2 and 3. FIG. 2 shows the reverse conducting insulated gate power semiconductor device according to the first embodiment in a vertical cross section along line I-I' in FIG. 3, which shows the reverse conducting insulated gate power semiconductor device of FIG. 2 in top view.

The reverse conducting insulated gate power semiconductor device according to the first embodiment is a planar RC-IGBT 1. The RC-IGBT 1 comprises a wafer 10 having a first main side 11 and a second main side 12 opposite to the first main side 11. A first main electrode 21 is formed on the first main side 11 and a second main electrode 22 is formed on the second main side 12. The first main electrode 21 forms the emitter electrode of the RC-IGBT 1 and the second main electrode 22 forms the collector electrode of the RC-IGBT 1. The wafer 10 comprises between the first main electrode 21 and the second main electrode 22 an (n⁻)-type drift layer 31a, an (n⁺)-type buffer layer 31b, a p-type collector layer 32, at least one (n⁺)-type collector short 33, a plurality of active unit cells 40 adjacent to the first main side 11 and a pilot diode unit cell 50. The drift layer 31a and the buffer layer 31b form an n-type first base layer 31. The collector layer 32 is in direct contact with the n-type first base layer 31 to form a first pn junction and is in direct contact with the second main electrode 22. The collector shorts 33 electrically connect the n-type first base layer 31 to the second main electrode 22.

The buffer layer 31b is arranged on the drift layer 31a towards the second main side 12 to separate the collector layer 32 from the drift layer 31a. Accordingly, the RC-IGBT 1 as shown in FIGS. 2 and 3 has a punch-through (PT) configuration. The buffer layer 31b may either have a constant doping concentration profile, or may have a gradually rising doping concentration profile in a direction towards the second main side 12. In operation of the RC-IGBT 1 at higher blocking voltages, the electric field at the interface between the drift layer 31a and buffer layer 31b will not have reached zero. Along a short distance in the buffer layer 31b it is then steeply decreased to zero due to the relatively high doping concentration thereof.

The pilot diode unit cell 50 comprises a p-type anode region 51 extending from the first main side 11 to a first depth d1. The anode region 51 is in direct contact with the first main electrode 21 and is also in direct contact with the n-type first base layer 31 to form a second pn junction.

Each active unit cell 40 comprises an n-type first source layer 41a and an n-type second source layer 41b, and a p-type second base layer 42 which is arranged on a side of the n-type first base layer 31 opposite to the collector layer 32. The n-type first base layer 31 is in direct contact with the p-type second base layer 42 to form a third pn junction, and the p-type second base layer 42 is in direct contact with the first source layer 41a to form a fourth pn junction and is in direct contact with the second source layer 41b to form a fifth pn junction. The p-type second base layer 42 is formed as a well region in the n-type first base layer 31 adjacent to the first main side 11, and the first source layer 41a and the second source layer 41b are formed as well regions in the p-type second base layer 42 adjacent to the first main side 11. Each active unit cell 40 further comprises a first gate electrode 47a, which is separated from the first source layer 41a, the p-type second base layer 42 and the n-type first base layer 31 by a first gate insulating layer 46a to form a first metal-insulator-semiconductor (MIS) field effect transistor (FET) structure adjacent to the first main side 11. Further, each active unit cell comprises a second gate electrode 47b, which is separated from the second source layer 41b, the p-type second base layer 42 and the n-type first base layer 31 by a second gate insulating layer 46b to form a second planar MISFET structure adjacent to the first main side 11. The first MISFET structure and the second MISFET structure may form a double-diffused MOS (DMOS) structure at the first main side 11.

A lateral size w of the anode region 51 in an orthogonal projection onto a vertical plane perpendicular to the first main side 11 is equal to or less than 1 μm, wherein a lateral direction is defined as a direction parallel to the first main side 11. The before mentioned vertical plane perpendicular to the first main side 11 is the drawing plane of FIG. 2. On a first lateral side surface of the anode region 51 (on the left side of the anode region 51 in FIG. 2) a first insulating layer 52a is arranged, and on a second lateral side surface of the anode region 51 (the right side of the anode region 51 in FIG. 2) opposing to the first lateral side surface of the anode region 51 in a direction which is parallel to the first main side 11 and which is parallel to the vertical plane, a second insulating layer 52b is arranged. The distance between the first insulating layer 52a and the second insulating layer 52b is equal to the lateral size w of the anode region 51. That is, in a vertical cross-section of the pilot diode unit cell 50 with the before mentioned vertical plane, a distance between the first insulating layer 52a and the second insulating layer 52b is equal to or less than 1 μm. Accordingly, the anode region 51 is laterally sandwiched between the first insulating layer 52a and the second insulating layer 52b. It laterally extends from the first insulating layer 52a to the second insulating layer 52b.

The first insulating layer 52a extends vertically from the first main side 11 to a second depth d2 and the second insulating layer 52b extends vertically from the first main side 11 to a third depth d3. The first depth d1 is less than the second depth d2 and is also less than the third depth d3. In the first embodiment as shown in FIG. 2, the second depth d2 and the third depth d3 are identical. However, the second depth d2 and the third depth d3 may also differ from each other. Exemplarily, the first depth d1 is less than 50% of the second depth d2 and is less than 50% of the third depth d3, more exemplarily the first depth d1 is less than one third of the second depth d2 and is less than one third of the third depth d3.

Figure 3:
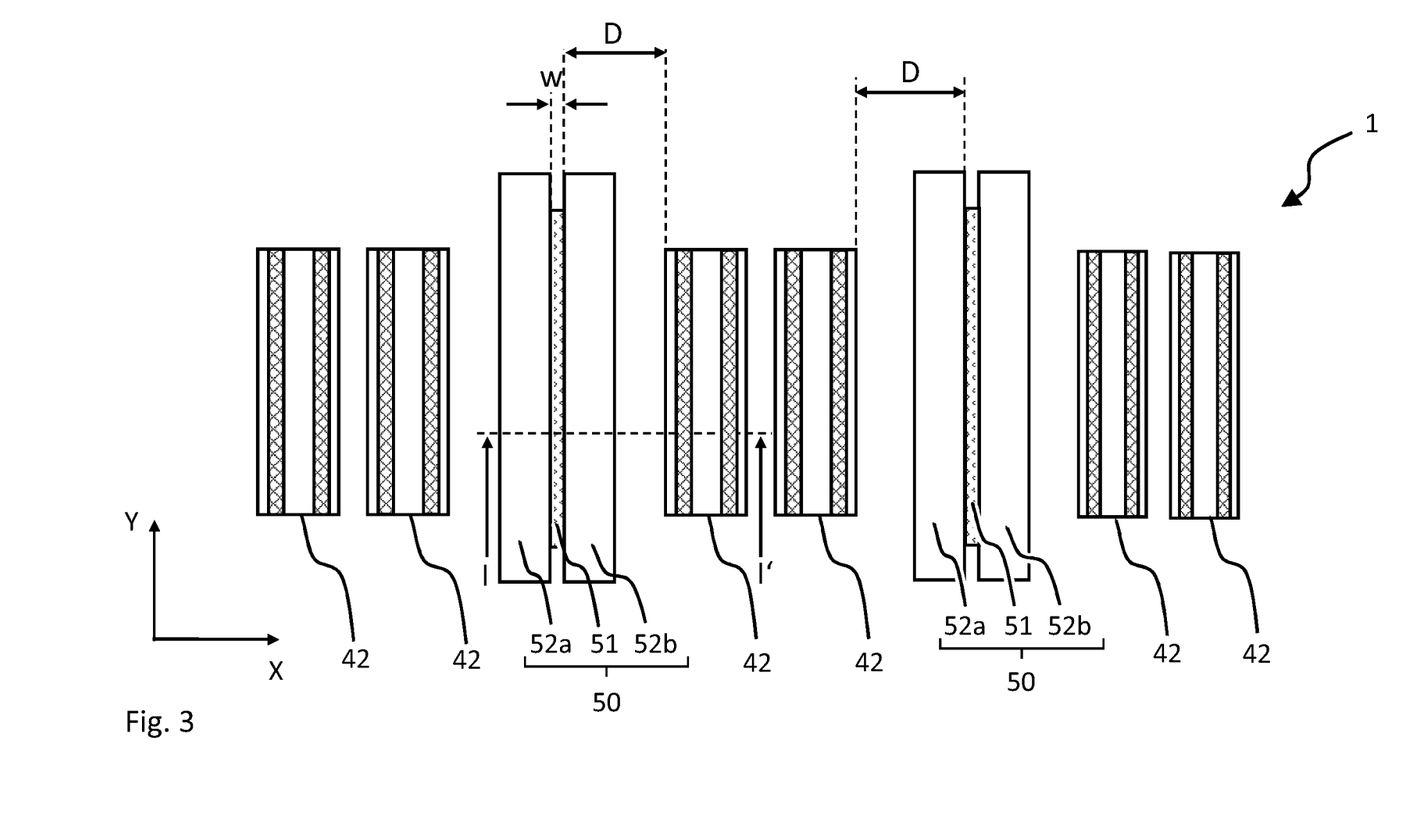
FIG. 3 shows the reverse conducting insulated gate power semiconductor device of FIG. 2 in top view.

As can be seen from FIGS. 2 and 3 the anode region 51 of each pilot diode unit cell 50 is laterally separated from the p-type second base layer 42 of each directly neighbouring (i.e. adjacent) active unit cell 40 by the first insulating layer 52a or the second insulating layer 52b. That means that any straight line connecting any first point in the p-type second base layer 42 of an adjacent active unit cell 40 with any second point in the anode region 51 intersects either the first or the second insulating layer 52a or 52b, wherein the adjacent active unit cell 40 is that active unit cell 40 of the plurality of active unit cells 40 of which the p-type second base layer 42 has a smallest lateral distance D to the anode region 51.

The lateral distance D between the anode region 51 and the p-type second base layer 42 of the adjacent active unit cell 40 is at least 15 μm. Accordingly, a lateral distance of the anode region 51 to the p-type second base layer 42 of each active unit cell 40 in the RC-IGBT 1 is at least 15 μm.

On the first main side 11 of the wafer 10, an insulating layer 72 is formed continuously in a region extending from above the anode region 51 to the p-type second base layer 42 of the adjacent active unit cell 40, so that the wafer 10 is electrically insulated from the first main electrode 21 in this area.

As can be seen best from FIG. 3 the p-type second base layer 42, the first gate electrode 45a and the second gate electrode 45b of each active unit cell 40 have in an orthogonal projection onto a plane parallel to the first main side 11 respectively a stripe-shape, a longitudinal main axis of the stripe-shape being respectively parallel to a first direction Y parallel to the first main side 11. In FIG. 3 the first direction Y is an up-down direction in the drawing plane.

As can be seen further in FIG. 3 the RC-IGBT 1 comprises plural stripe-shaped pilot diode unit cells 50, wherein, in a second direction X parallel to the first main side 11 and perpendicular to the first direction Y, the pilot diode unit cells 50 alternate with groups of active unit cells 40, wherein each group of active unit cells 40 comprises plural active unit cells 40. Exemplarily, each group of active unit cells comprises two active unit cells 40 as shown in FIG. 3.

Next, a second embodiment of the reverse conducting insulated gate power semiconductor device according to the invention is discussed with reference to FIGS. 4 and 5. In view of the many similarities between the first embodiment and the second embodiment, mainly differences between the first and the second embodiment will be described, whereas features which are the same for both embodiments will not necessarily be described again. Specifically, a detailed description of elements having the same reference signs will not be repeated again, but it is referred to the above description of the first embodiment. Where it is not explicitly mentioned in the following description the second embodiment may be the same as the first embodiment.

Figure 4:
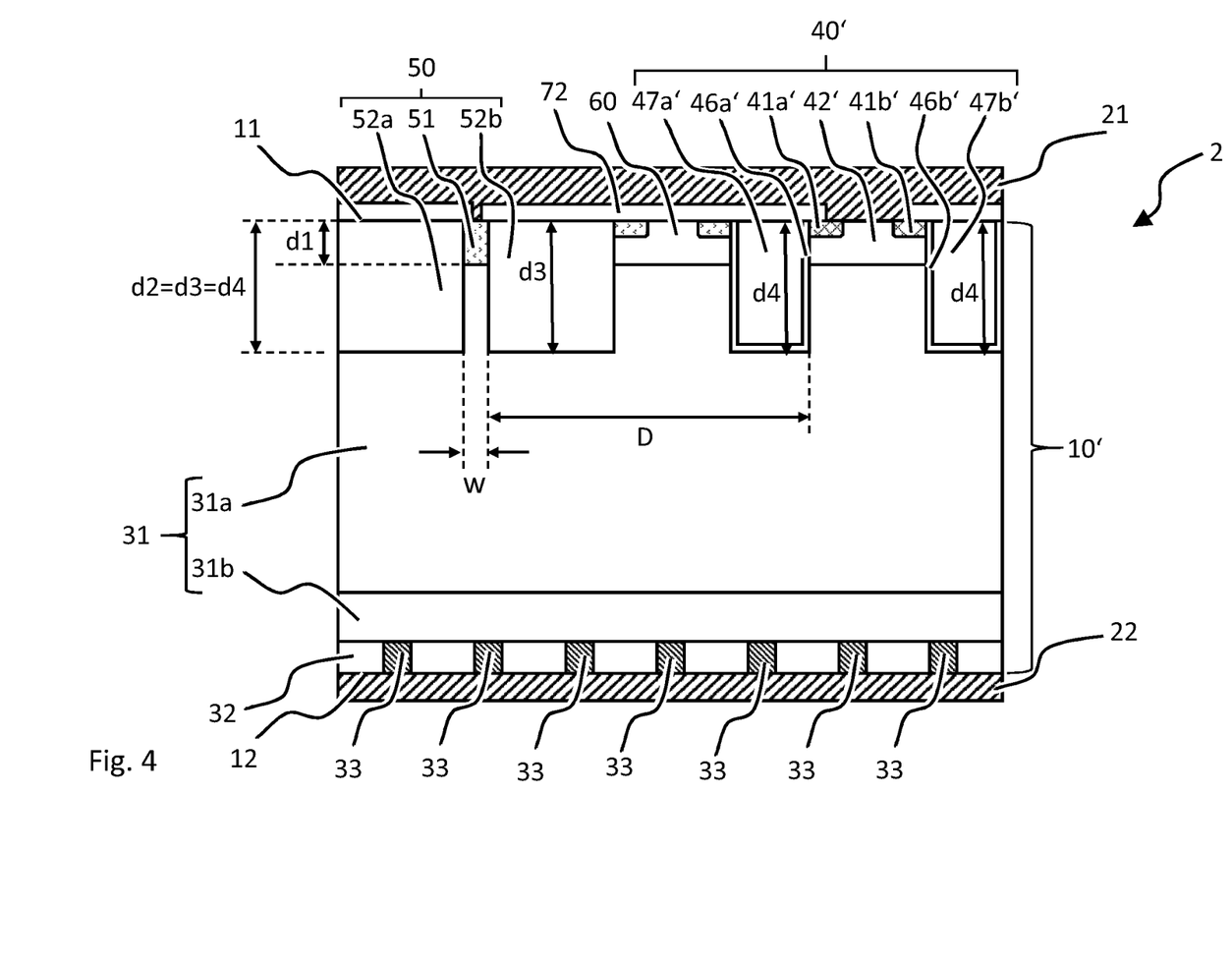
FIG. 4 shows a reverse conducting insulated gate power semiconductor device according to a second embodiment in a vertical cross-section along line II-II' in FIG. 5.
Figure 5:
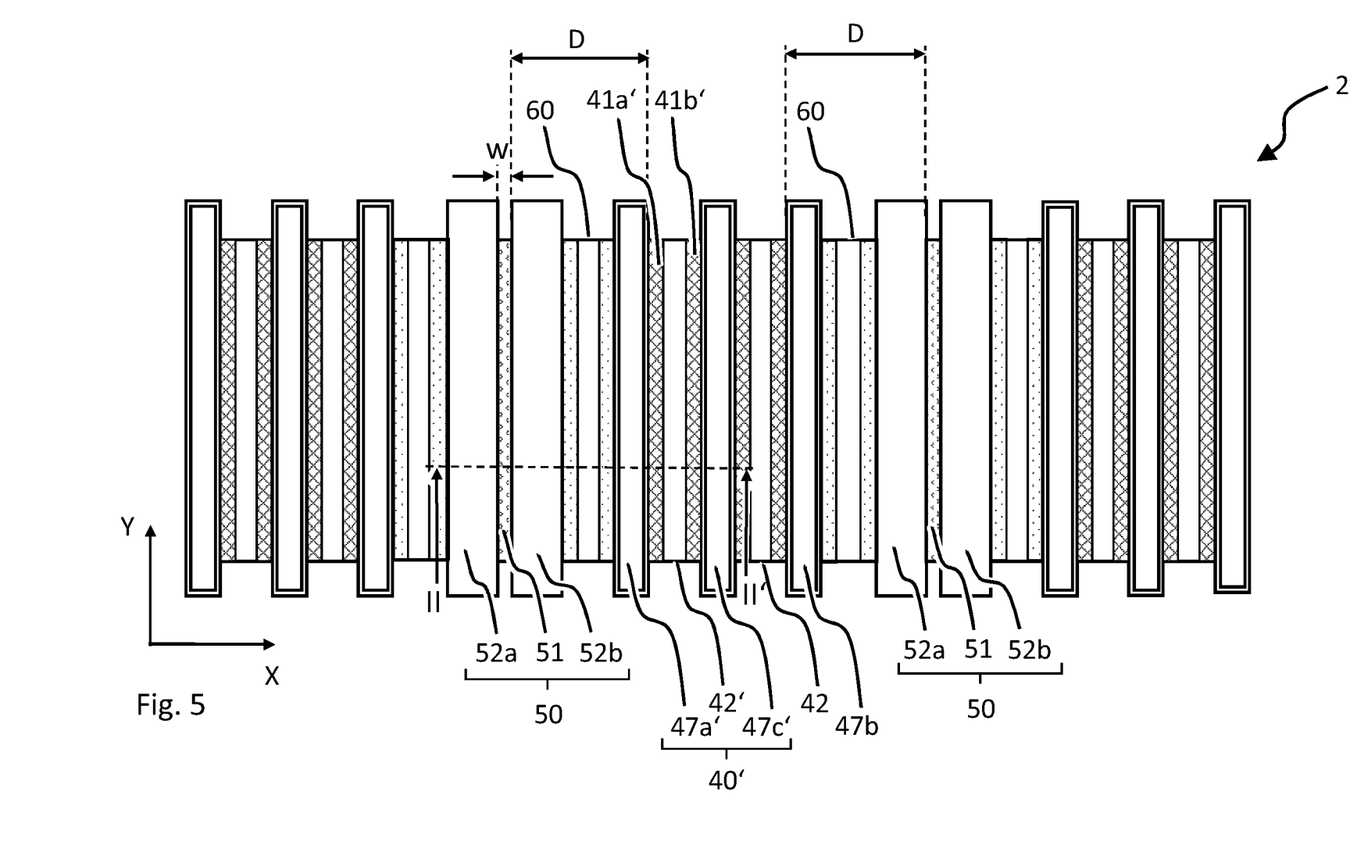
FIG. 5 shows the reverse conducting insulated gate power semiconductor device of FIG. 4 in top view.

FIG. 4 shows the reverse conducting insulated gate power semiconductor device according to the second embodiment in a vertical cross section along line II-II' in FIG. 5, which shows a top view of the reverse conducting insulated gate power semiconductor device of FIG. 4. The reverse conducting insulated power semiconductor device according to the second embodiment is a trench RC-IGBT 2. The pilot diode unit cell 50 in the trench RC-IGBT 2 of the second embodiment has the same structure and features as the pilot diode unit cell 50 in the first embodiment. Also, the wafer 10' has the same features regarding the drift layer 31a, the buffer layer 31b, the collector layer 32 and the collector shorts 33. However, the active unit cells 40' are trench-type active unit cells, whereas the active unit cells 40 in the first embodiment are planar active unit cells.

Each trench-type active unit cell 40' comprises an n-type first source layer 41a' and an n-type second source layer 41b', and a p-type second base layer 42' which is arranged on a side of the n-type first base layer 31 opposite to the collector layer 32. The n-type first base layer 31 is in direct contact with the p-type second base layer 42 to form a third pn junction, and the p-type second base layer 42 is in direct contact with the first source layer 41a' to form a fourth pn junction and is in direct contact with the second source layer 41b' to form a fifth pn junction. The p-type second base layer 42' is formed as a well region in the n-type first base layer 31 adjacent to the first main side 11, and the first source layer 41a and the second source layer 41b are formed as well regions in the p-type second base layer 42' adjacent to the first main side 11. Each active unit cell 40' further comprises a first gate electrode 47a', which is separated from the first source layer 41a', the p-type second base layer 42' and the n-type first base layer 31 by a first gate insulating layer 46a' to form a first vertical metal-insulator-semiconductor (MIS) field effect transistor (FET) structure adjacent to the first main side. Further, each active unit cell 40' comprises a second gate electrode 47b', which is separated from the second source layer 41b', the p-type second base layer 42' and the n-type first base layer 31 by a second gate insulating layer 46b' to form a second vertical MISFET structure adjacent to the first main side 11. The first gate electrode 47a' is a trench gate electrode that extends into the wafer 10' from the first main side 11 in a first trench, the sidewalls of which are covered by the first gate insulating layer 46a'. Likewise, the second gate electrode 47b' is a trench gate electrode that extends into the wafer 10' from the first main side 11 in a second trench, the sidewalls of which are covered by the second gate insulating layer 46b'. The first trench filled with the first gate insulation layer 46a' and the first gate electrode 47a' extends from the first main side 11 into the wafer 10' to a fourth depth d4 as shown in FIG. 4. Likewise, the second trench filled with the second gate insulation layer 46b' and the second gate electrode 47b' extends from the first main side 11 into the wafer 10' to the fourth depth d4 as shown in FIG. 4. In the active unit cell 40' the second base layer 42', the first source layer 41a' and the second source layer 41b' are laterally sandwiched between the first and the second gate electrode 47a' and 47b'.

In the exemplary embodiment shown in FIG. 4, the second depth d2, the third depth d3 and the fourth depth d4 are all the same. However, the fourth depth may be smaller than the second and/or third depths d2 and d3. Making d2 and d3 larger than d4 provides an additional de-coupling effect that may further decrease the outflow of holes into the anode region 51 in the forward conducting on-state (IGBT mode) of the RC-IGBT. Two neighbouring active cells 40' may share a common trench gate electrode 47a' as shown in FIG. 5. Alternatively, the first trench and the second trench may extend to different depths in the wafer 10'.

In the RC-IGBT 2, laterally between each pilot diode unit cell 50 and the second conductivity type base layer 42' of an adjacent active unit cell 40', there is arranged the first gate electrode 47a of the adjacent active unit cell 40', which is that active unit cell 40' of the plurality of active unit cells 40' of which the second conductivity type base layer 42' has the smallest lateral distance to the anode region 51 of the respective pilot diode unit cell 50.

As shown in FIG. 5 the first gate electrode 47a', the second gate electrode 47b' of each active unit cell 40' have in an orthogonal projection onto a plane parallel to the first main side 11 a stripe-shape, a longitudinal main axis of which is parallel to the first direction Y.

Similar to the first embodiment the RC-IGBT 2 comprises plural stripe-shaped pilot diode unit cells 50, wherein, in a second direction X parallel to the first main side 11 and perpendicular to the first direction Y, pilot diode unit cells 50 alternate with groups of active unit cells 40', wherein each group of active unit cells 40' comprises two active unit cells 40'. In the exemplary embodiment shown in FIG. 5 each group comprises two active unit cells 40' that share a common gate electrode 47b. Alternatively, each group of active unit cells may comprise one single active unit cell 40' or more than two active unit cells 40'.

In the second embodiment the pilot diode unit cell 50 is separated from the adjacent active unit cell 40' by a dummy cell 60 which includes a p-type base layer, a first source region and a second source region similar to the active unit cell 40' but wherein these layers are not connected to the first main electrode 21. Similar to the first embodiment, an insulating layer 72 is formed continuously in a region extending from above the anode region 51 to the p-type second base layer 42' of the adjacent active unit cell 40', so that the wafer 10' is electrically insulated from the first main electrode 21 in this area.

Figure 6:
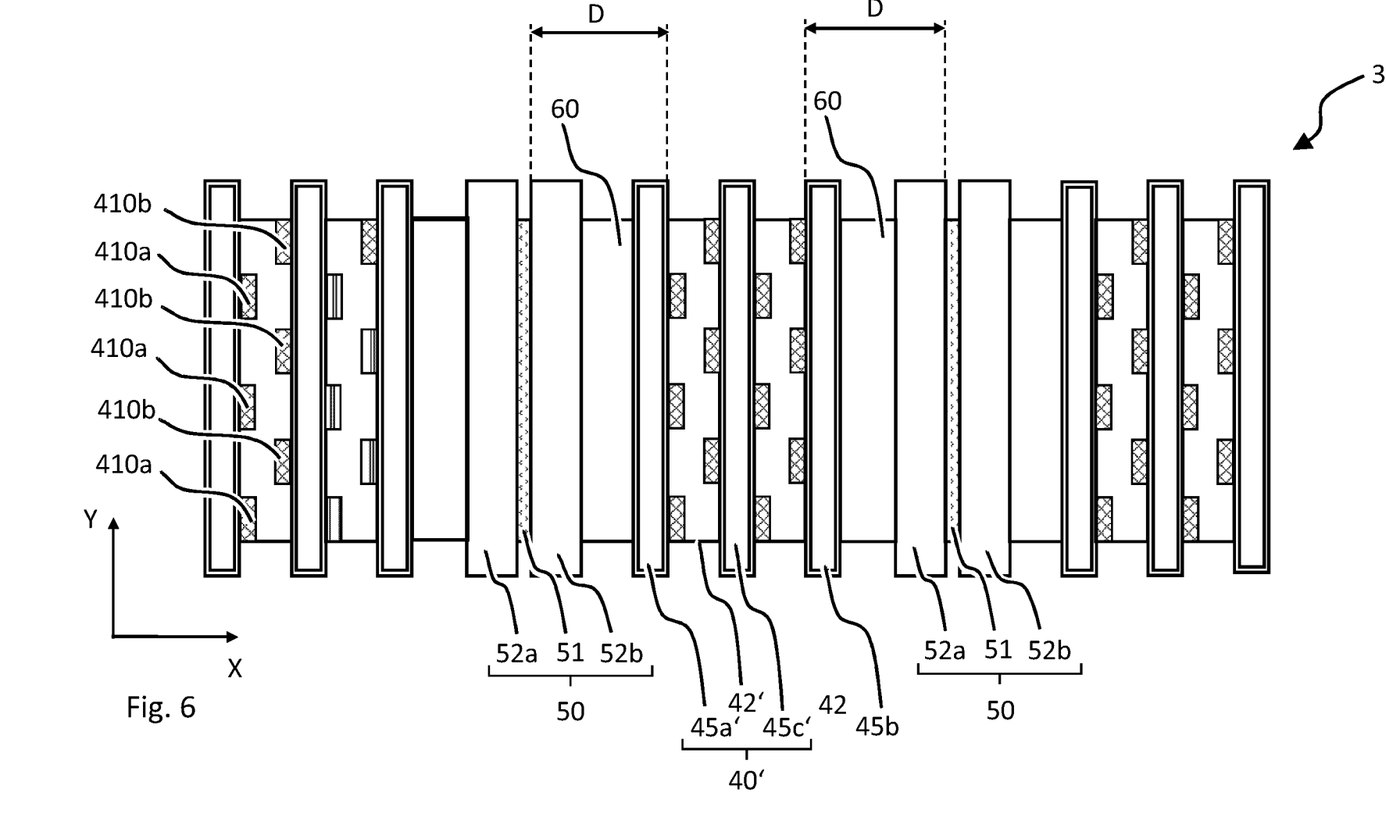
FIG. 6 shows a reverse conducting insulated gate power semiconductor device according to a third embodiment in top view.

In FIG. 6 there is shown a reverse conducting insulated gate power semiconductor device according to a third embodiment. The reverse conducting insulated gate power semiconductor device according to the third embodiment is a trench RC-IGBT 3 similar to the RC-IGBT 2 according to the second embodiment. The RC-IGBT 3, which is shown in top view in FIG. 6 differs from the RC-IGBT 2 only in that the first gate source layer 41a' is separated into plural separate first source layer regions 470a and the second gate source layer 41b' is separated into plural separate second source layer regions 410b. Along a direction parallel to the first direction Y, the first source layer regions 410a alternate with second source layer regions 410b.

Figure 7:
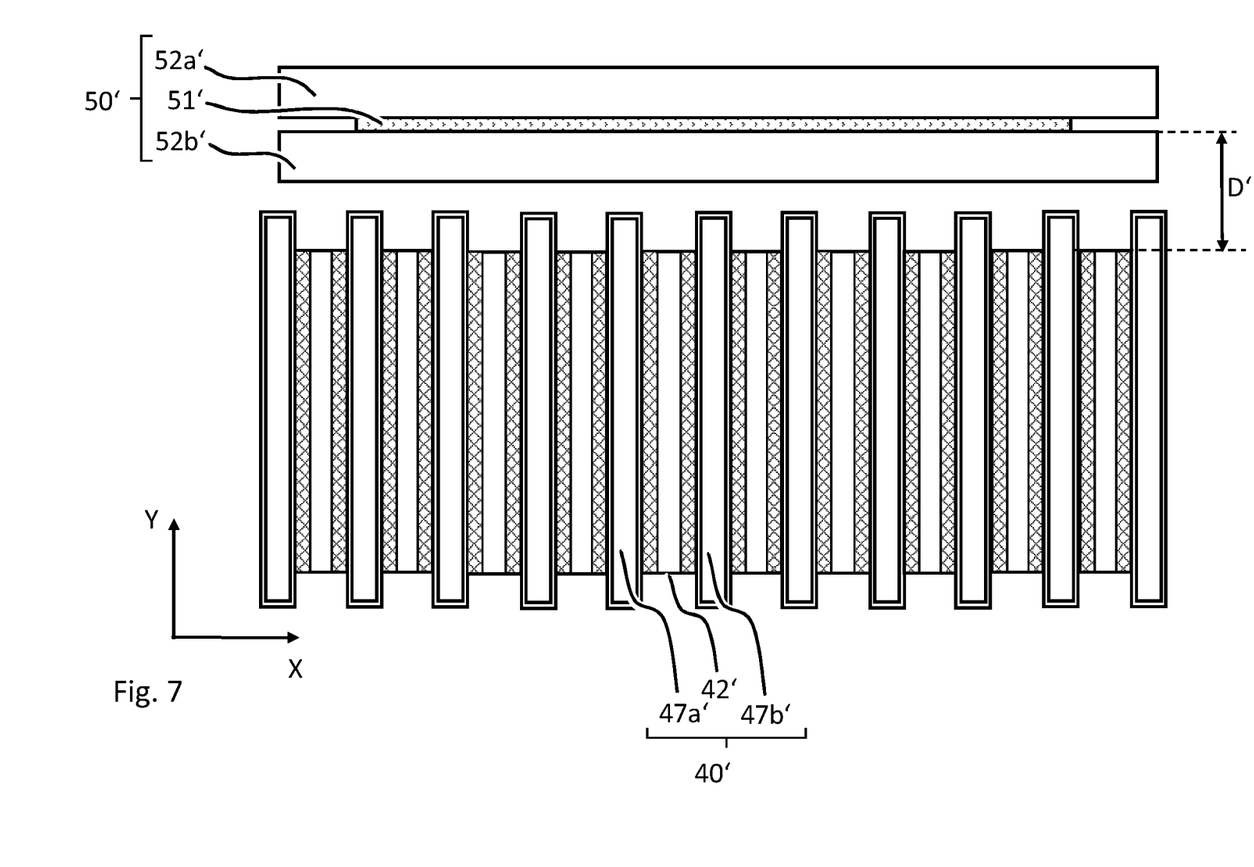
FIG. 7 shows a reverse conducting insulated gate power semiconductor device according to a fourth embodiment in top view.

In FIG. 7 there is shown a reverse conducting insulated gate power semiconductor device according to a fourth embodiment in top view. The reverse conducting insulated gate power semiconductor device according to the fourth embodiment is a trench RC-IGBT 4 which differs from the RC-IGBT 2 only in that the stripe-shaped pilot diode unit cell 50' has a different orientation relative to the stripe-shaped active unit cells 40'. Instead of being arranged with its main axis parallel to the stripe-shaped active unit cells 40', the stripe-shaped pilot diode region 50' is oriented perpendicular to the stripe-shaped active unit cells 40'. Otherwise the structure of the RC-IGBT 4 is similar to the above described RC-IGBT 2. In particular, the structure of the stripe-shaped pilot diode unit cell 50' is the same as the structure of the pilot diode unit cell 50 in the first to third embodiment. Like in the above embodiments, a minimum distance D' between the anode region 51' to the p-type second base layer 42' of each active unit cell 40' is at least 15 µm.

It will be appreciated by those skilled in the art that the present invention can be embodied in other specific forms without departing from the scope of the invention as defined by the appended claims.

For example in the above embodiments the adjacent trench-type active unit cells 40, 40' may not necessarily share a common gate electrode 47b but may be physically separated and distanced from each other.

While the above described reverse conducting insulated gate power semiconductor devices were punch-trough (PT) RC-IGBTs 1-4 with a buffer layer 31b, the reverse conducting insulated gate power semiconductor device of the invention may also be a non-punch through (NPT) device without any buffer layer 31b.

In the above embodiments the cell structure of the active unit cells 40, 40' was described to be a stripe-shaped cell structure. However in the reverse conducting insulated gate power semiconductor device of the invention the active unit cells 40, 40' may also have any other shape in orthogonal projection onto a plane parallel to the first main side 11 such as a hexagonal shape or a polygonal shape. For example, other designs for the trench gate electrode are also possible like square design, circular design, ring design, hexagonal design, etc. Likewise, while in the above embodiments the pilot diode unit cell 50, 50' was described with a stripe-shape. However, the pilot diode unit cells may also have any other shape in orthogonal projection onto a plane parallel to the first main side 11 such as a hexagonal shape or a polygonal shape.

While the insulating layers 52a, 52b, 52a' and 52b' were shown above as being arranged in trenches continuously filled with the insulating material, these insulating layers may also be provided in the same way as the gate insulating layers 46a, 46b as layers covering the bottom and side walls of a trench which is otherwise filled with an electrically conductive material. This electrically conductive material may exemplarily be connected electrically to the first main electrode 21.

In the above embodiments the reverse conducting insulated gate power semiconductor device of the invention was described to be an RC-IGBT 1, 2, 3, 4. However, the reverse conducting insulated gate power semiconductor device of the invention may be also another semiconductor device such as a bi-mode insulated gate transistor (BIGT), in which an IGBT and an RC-IGBT are integrated in a single wafer, i.e. the collector layer comprises areas with collector shorts and wide areas without collector shorts (exemplarily the wide areas without collector shorts have a width in any lateral direction which is at least three times the average distance between each pair of directly adjacent collector shorts, wherein a first collector short shall be directly adjacent to a second collector short if no other collector short is closer to the second collector short than the first collector short. The term bi-mode implies that the device can operate at the same current densities in transistor (IGBT) mode and freewheeling diode mode by utilizing the same available silicon volume in both operational modes.

In addition the above described RC-IGBTs 1, 2, 3, 4 may include further features such as an enhancement layer, which is a layer having the same conductivity type as the drift layer 31a but which has a higher doping concentration. The enhancement layer may be arranged between the drift layer 31a and the second base layer 42, 42'. There may also be arranged additional p-type regions in a trench RC-IGBT in the drift layer for example at the bottom side of the trench gate electrode for protecting the trench gate electrodes against high electric fields.

In all embodiments, the conductivity types may be switched, i.e. in an alternative embodiment all layers within one specific embodiment which are described above as n-type are all p-type and all layers which are described above to be p-type are n-type.

It should be noted the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

The invention claimed is:

1. A reverse conducting insulated gate power semiconductor device comprising a wafer having a first main side and a second main side opposite to the first main side, a first main electrode on the first main side and a second main electrode on the second main side, wherein the wafer comprises:
   a first conductivity type base layer;
   a second conductivity type collector layer in direct contact with the first conductivity type base layer to form a first pn junction, the second conductivity type collector layer in electrical contact with the second main electrode, wherein the second conductivity type is different from the first conductivity type;
   a collector short electrically connecting the first conductivity type base layer to the second main electrode;
   a pilot diode unit cell comprising:
      a second conductivity type anode region extending from the first main side to a first depth, wherein the anode region is in direct contact with the first main electrode and is in direct contact with the first conductivity type base layer to form a second pn junction and wherein a lateral size of the anode region in an orthogonal projection onto a vertical plane perpendicular to the first main side is equal to or less than 1 μm, a lateral direction being defined as a direction parallel to the first main side;
      a first insulating layer arranged on a first lateral side surface of the anode region and extending from the first main side to a second depth that is greater than the first depth;
      a second insulating layer arranged on a second lateral side surface of the anode region and extending from the first main side to a third depth that is greater than the first depth, the second insulating layer being laterally spaced from the first insulating layer by the anode region, wherein, in a vertical cross-section of the pilot diode unit cell with the vertical plane, a distance between the first insulating layer and the second insulating layer is equal to or less than 1 μm; and
   a plurality of active unit cells adjacent to the first main side wherein each active unit cell comprises:
      a first conductivity type first source layer in electrical contact with the first main electrode on the first main side;
      a second conductivity type base layer on a side of the first conductivity type base layer opposite to the collector layer, wherein the first conductivity type base layer is in direct contact with the second conductivity type base layer to form a third pn junction and wherein the second conductivity type base layer is in direct contact with the first source layer to form a fourth pn junction; and
      a first gate electrode, which is separated from the first source layer, the second conductivity type base layer and the first conductivity type base layer by a first gate insulating layer to form a field effect transistor structure.

2. The device according to claim 1, wherein the second conductivity type collector layer is in direct contact with the second main electrode and wherein the first conductivity type first source layer is in direct contact with the first main electrode.

3. The device according to claim 1, wherein any straight line connecting any first point in the second conductivity type base layer of an adjacent active unit cell with any second point in the anode region intersects the first or second insulating layer, wherein the adjacent active unit cell is that active unit cell of the plurality of active unit cells of which the second conductivity type base layer has the smallest lateral distance to the anode region.

4. The device according to claim 3, wherein a surface portion of the wafer extending on the first main side from the anode region to the second conductivity type base layer of the adjacent active unit cell is electrically insulated from the first main electrode.

5. The device according to claim 1, wherein a lateral distance of the anode region to the second conductivity type base layer of each active unit cell is at least 15 μm.

6. The device according to claim 1, wherein the anode region extends in the vertical cross-section laterally from the first insulating layer to the second insulating layer.

7. The device according to claim 1, wherein the first depth is less than 50% of the second depth and less than 50% of the third depth.

8. The device according to claim 1, wherein the first depth is less than one third of the second depth and less than one third of the third depth.

9. The device according to claim 1, wherein the second depth is the same as the first depth.

10. The device according to claim 1, further comprising a dummy cell arranged laterally between the pilot diode unit cell and an adjacent active unit cell, the dummy cell having a second conductivity base layer and source layer having the same structure as corresponding layers in the active unit cells except that the second conductivity base layer and the source layer of the dummy cell are not electrically connected to the first main electrode, wherein the adjacent active unit cell is that active unit cell of the plurality of active unit cells of which the second conductivity type base layer has the smallest lateral distance to the anode region.

11. A reverse conducting insulated gate power semiconductor device comprising a wafer having a first main side and a second main side opposite to the first main side, a first main electrode on the first main side and a second main electrode on the second main side, wherein the wafer comprises:
   a first conductivity type base layer;
   a second conductivity type collector layer in direct contact with the first conductivity type base layer to form a first pn junction, the second conductivity type collector layer in electrical contact with the second main electrode, wherein the second conductivity type is different from the first conductivity type;

a collector short electrically connecting the first conductivity type base layer to the second main electrode;
a pilot diode unit cell comprising:
   a second conductivity type anode region extending from the first main side to a first depth, wherein the anode region is in direct contact with the first main electrode and is in direct contact with the first conductivity type base layer to form a second pn junction and wherein a lateral size of the anode region in an orthogonal projection onto a vertical plane perpendicular to the first main side is equal to or less than 1 µm, a lateral direction being defined as a direction parallel to the first main side;
   a first insulating layer arranged on a first lateral side surface of the anode region and extending from the first main side to a second depth that is greater than the first depth;
   a second insulating layer arranged on a second lateral side surface of the anode region and extending from the first main side to a third depth that is greater than the first depth, the second insulating layer being laterally spaced from the first insulating layer by the anode region, wherein, in a vertical cross-section of the pilot diode unit cell with the vertical plane, a distance between the first insulating layer and the second insulating layer is equal to or less than 1 µm; and
a plurality of active unit cells adjacent to the first main side wherein each active unit cell comprises:
   a first conductivity type first source layer in electrical contact with the first main electrode on the first main side;
   a second conductivity type base layer on a side of the first conductivity type base layer opposite to the collector layer, wherein the first conductivity type base layer is in direct contact with the second conductivity type base layer to form a third pn junction and wherein the second conductivity type base layer is in direct contact with the first source layer to form a fourth pn junction; and
   a first gate electrode, which is separated from the first source layer, the second conductivity type base layer and the first conductivity type base layer by a first gate insulating layer to form a field effect transistor structure, wherein the second conductivity type base layer and the first gate electrode having a stripe-shape in an orthogonal projection onto a plane parallel to the first main side, a longitudinal main axis of the stripe-shape being parallel to a first direction.

12. The device according to claim 11, wherein the pilot diode unit cell is stripe-shaped, wherein the anode region, the first insulating layer and the second insulating layer each have a stripe-shape in the orthogonal projection onto the plane parallel to the first main side, a longitudinal main axis of the stripe-shapes each being parallel to the first direction.

13. The device according to claim 12, comprising a plurality of stripe-shaped pilot diode unit cells, wherein the pilot diode unit cells alternate with groups of active unit cells in a second direction parallel to the first main side and perpendicular to the first direction, wherein each group of active unit cells comprises a plurality of active unit cells.

14. The device according to claim 11, wherein the field effect transistor structure of each active unit cell is a trench field effect transistor structure in which the first gate electrode is structured as a first trench gate electrode.

15. The device according to claim 14, wherein the first gate electrode of an adjacent active unit cell is arranged laterally between each pilot diode unit cell and the second conductivity type base layer of the adjacent active unit cell, the adjacent unit cell that active unit cell of the plurality of active unit cells of which the second conductivity type base layer has the smallest lateral distance to the anode region of the respective pilot diode unit cell.

16. The device according to claim 14, wherein each active unit cell further comprises:
   a first conductivity type second source layer in direct contact with the first main electrode on the first main side and in direct contact with the second conductivity type base layer to form a fifth pn junction; and
   a second gate electrode separated from the second source layer, the second conductivity type base layer and the first conductivity type base layer by a second gate insulating layer to form a second field effect transistor structure in the active unit cell, wherein the first gate electrode and the second gate electrode are trench gate electrodes between which the second conductivity type base layer and the first source layer and the second source layer are laterally interposed.

17. The device according to claim 16, wherein the second gate electrode of each active unit cell has a stripe-shape in an orthogonal projection onto a plane parallel to the first main side, a longitudinal main axis of the second gate electrode being parallel to the first direction.

18. The device according to claim 17, wherein the first source layer comprises a plurality of separate first source layer regions and the second source layer comprises a plurality separate second source layer regions, wherein first source layer regions alternate with second source layer regions along a direction parallel to the first direction.

19. A reverse conducting insulated gate power semiconductor device comprising a wafer having a first main side and a second main side opposite to the first main side, a first main electrode on the first main side and a second main electrode on the second main side, wherein the wafer comprises:
   a first conductivity type base layer;
   a second conductivity type collector layer in direct contact with the first conductivity type base layer to form a first pn junction, the second conductivity type collector layer in electrical contact with the second main electrode, wherein the second conductivity type is different from the first conductivity type;
   a collector short electrically connecting the first conductivity type base layer to the second main electrode;
   a pilot diode unit cell comprising:
      a second conductivity type anode region extending from the first main side to a first depth, wherein the anode region is in direct contact with the first main electrode and is in direct contact with the first conductivity type base layer to form a second pn junction and wherein a lateral size of the anode region in an orthogonal projection onto a vertical plane perpendicular to the first main side is less than or equal to 1 µm, a lateral direction being defined as a direction parallel to the first main side;
      a first insulating layer arranged on a first lateral side surface of the anode region and extending from the first main side to a second depth that is at least twice the first depth;
      a second insulating layer arranged on a second lateral side surface of the anode region and extending from the first main side to the second depth, the second insulating layer being laterally spaced from the first insulating layer by the anode region, wherein, in a vertical cross-section of the pilot diode unit cell with the vertical plane, a distance between the first insulating layer and the second insulating layer is less than or equal to 1 µm;

a plurality of active unit cells adjacent to the first main side, the active unit cells including an adjacent active unit cell that is the active unit cell that is closest to the anode region, wherein each active unit cell comprises:

a first conductivity type first source layer in electrical contact with the first main electrode on the first main side;

a second conductivity type base layer on a side of the first conductivity type base layer opposite to the collector layer, wherein the first conductivity type base layer is in direct contact with the second conductivity type base layer to form a third pn junction and wherein the second conductivity type base layer is in direct contact with the first source layer to form a fourth pn junction; and a first gate electrode, which is separated from the first source layer, the second conductivity type base layer and the first conductivity type base layer by a first gate insulating layer to form a field effect transistor structure; and a dummy cell arranged laterally between the pilot diode unit cell and the adjacent active unit cell, the dummy cell having a second conductivity base layer and source layer having the same structure as corresponding layers in the active unit cells except that the second conductivity base layer and the source layer of the dummy cell are not electrically connected to the first main electrode.

20. The device according to claim 19, wherein the second conductivity type base layer and the first gate electrode of each active unit cell have a stripe-shape in an orthogonal projection onto a plane parallel to the first main side, a longitudinal main axis of the stripe-shape being parallel to a first direction parallel to the first main side.

* * * * *